United States Patent
Hsieh et al.

(10) Patent No.: US 6,180,451 B1
(45) Date of Patent: Jan. 30, 2001

(54) METHOD OF FORMING CAPACITOR WITH A HSG LAYER

(75) Inventors: Wen-Yi Hsieh; Juan-Yuan Wu, both of Hsinchu; Water Lur, Taipei, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/165,143

(22) Filed: Oct. 1, 1998

(30) Foreign Application Priority Data

Jun. 29, 1998 (TW) .................................................. 87110435

(51) Int. Cl.[7] ....................... H01L 21/8242; H01L 21/20; H01L 21/36
(52) U.S. Cl. ............................ 438/255; 438/491; 438/398; 438/390; 438/252; 438/253; 438/396
(58) Field of Search ....................................... 438/255, 491, 438/398, 390, 252, 253, 396, 250, 251, 239, 392, 238

(56) References Cited

PUBLICATIONS

Wolf, S.; Tauber, R. N.; Silicon Processing For The VLSI Era, vol. 1; Lattice Press; Sunset Beach, Ca.; 1986; pp. 261–265.*

* cited by examiner

*Primary Examiner*—Wael Fahmy
*Assistant Examiner*—Neal Berezny
(74) *Attorney, Agent, or Firm*—J.C. Patents; Jiawei Huang

(57) ABSTRACT

A method of forming a DRAM capacitor. A hemispherical grain structure is formed on the surface of the bottom electrode of the capacitor. By employing an additional annealing under a dopant contained ambient, the dopant is diffused into the hemispherical grain structure and distributed at the surface area of the hemispherical grain region.

20 Claims, 3 Drawing Sheets

METHOD OF FORMING CAPACITOR WITH A HSG LAYER

CROSS-REFERENCE TO RELATED APPLICATION

This application claims the priority benefit of Taiwan application serial no. 87110435, filed Jun. 29, 1998, the full disclosure of which is incorporated herein by reference.

BACKGROUND OF THE INVENTION

1. Field of the Invention

The invention relates in general to a method of fabricating a capacitor, and more particularly, to a method of selectively forming a hemispherical grain (HSG) on a dynamic random access memory (DRAM) capacitor.

2. Description of the Related Art

In a DRAM, the typical method to access data is by charging or discharging optionally into each capacitor of the capacitor array on the semiconductor substrate.

Due to the higher and higher integration of an integrated circuit (IC), dimensions of devices or structures (such as transistors, capacitors) become smaller and smaller. Thus, in a conventional planar capacitor, the storage of charges (that is, the capacitance) decreases. The decrease of charge storage causes various problems, including mechanical deterioration and charge leakage by the larger susceptibility, and therefore, causes potential loss. The charge leakage caused by larger susceptibility may cause more frequent refresh period, and by which, memory can not handle data saving and reading properly. Moreover, the decrease of charge storage may need more complex data reading plan, or more sensitive charge induction amplifier.

It has been a trend of fabricating a DRAM with a capacitor having an improved storage capacitance. However, as the dimension of the memory cell shrinks due to the requirement of high integration, the lateral area of the capacitor becomes smaller and smaller. To maintain the capacitance, or even to increase the capacitance of the capacitor of a DRAM, a three dimensional capacitor which extends vertically in surface area is developed. Another method to increase to the capacitance of a DRAM capacitor is to select a dielectric material with a higher dielectric constant.

Recently, a method of forming a hemispherical grain of the bottom electrode of a capacitor to increase the surface area has been developed to increase the capacitance.

A conventional method of forming a DRAM capacitor with a hemispherical grain structure is shown in FIG. 1A to FIG. 1B. In FIG. 1A, at least a metal-oxide semiconductor device (MOS) comprising a gate 102 and a source/drain region 104 is formed on a semiconductor substrate 100. An oxide layer 106 is formed on the substrate 100. Using photolithography and etching, a contact 108 is formed to penetrate through the oxide layer 106 and couple with the source/drain region 104. An amorphous silicon layer is formed on the oxide layer 106 and the contact 108. To increase the conductivity, the amorphous silicon layer is doped with wither N-type or P-type ions. The amorphous silicon layer is then patterned as denoted as 110 in the figure.

In FIG. 1B, in a high vacuum ambient at about 550° C. to 670°, the amorphous silicon layer 110 is annealed to crystallize. The amorphous silicon layer 110 is thus transformed into a poly-silicon layer 110a with a hemispherical grain structure 112 on the surface area. The poly-silicon layer 110a is then doped with ions to increase the conductivity.

The capacitor formed by the above conventional method has an increased surface area, and therefore, a larger capacitance is obtained. However, the dopant concentration near the surface of the hemispherical grain structure 112 is usually low. As shown in FIG. 2, an enlarged cross section view of the hemispherical grain structure is shown. By the conventional method, the doped ions are non-uniformly distributed. The surface dopant concentration 200 is lighter than the dopant concentration in the interior portion 202. The insufficient surface dopant concentration near of the hemispherical grain causes a low conductivity. While applying the hemispherical grain structure to a high density DRAM, a depletion region is formed which block the current flow. The capacitor is thus degraded.

SUMMARY OF THE INVENTION

It is an object of the invention to provide a method of forming a DRAM capacitor with a hemispherical grain structure. By introducing the DRAM device into a dopant contained ambient to perform an anneal process, the dopant is evenly distributed in the hemispherical grain structure, so that the hemispherical grain structure has a uniform dopant concentration. Using rapid thermal process (RTP) for the anneal process, an economic thermal budget is obtained. The small thermal budget is advantageous to sub-quarter micron very large scaled integration (VLSI) technologies.

To achieve the above-mentioned object and advantages, a method of forming a capacitor is provided. A semiconductor comprising a metal-oxide semiconductor is provided. The metal-oxide semiconductor comprises a gate and a source/drain region. An insulation layer is formed on the substrate to cover the gate and the source/drain region. A contact plug is formed to penetrate through the insulation layer and to couple with the source/drain region. A dope amorphous silicon layer is formed on the insulation layer and the contact plug. The amorphous silicon layer is defined to form a required patterned. The substrate is disposed in a vacuum ambient at about 550° C. to 670° C. for annealing to crystallize the amorphous silicon layer. The amorphous silicon layer is thus transformed into a poly-silicon layer. Meanwhile, a hemispherical grain structure is formed on the surface of the poly-silicon layer. The substrate is disposed in a dopant contained ambient at about 700° C. to 1000° C. for another annealing process. A dielectric layer is formed on the poly-silicon layer. Another poly-silicon layer is formed on the dielectric layer.

In addition to the application as a DRAM capacitor, a capacitor formed by the method according to the invention can also applied to other structures of a semiconductor substrate. Furthermore, the hemispherical grain structure 312 with a uniform dopant concentration can not only applied in forming a DRAM capacitor, but also can be applied in any structure which needs an increased surface area with a good conductivity.

Both the foregoing general description and the following detailed description are exemplary and explanatory only and are not restrictive of the invention, as claimed.

DESCRIPTION OF THE PREFERRED EMBODIMENTS

Figure 1A:
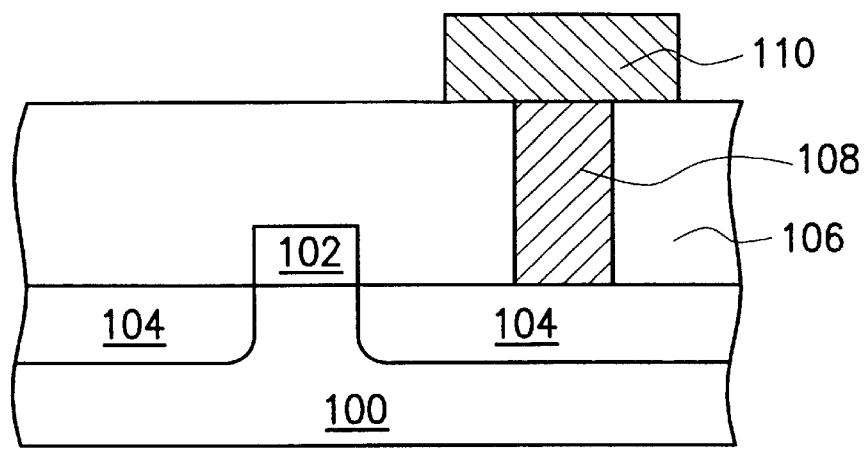
FIG. 1A to FIG. 1B are cross sectional views showing a conventional method of forming a DRAM capacitor.
Figure 1B:
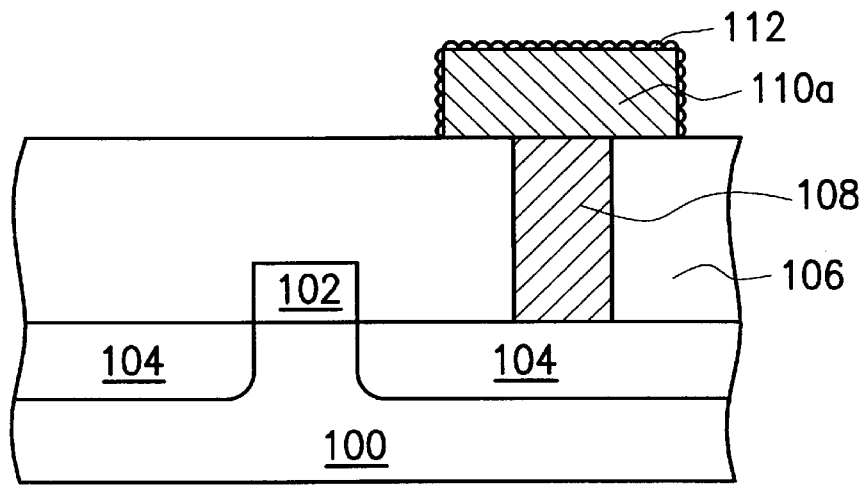
Figure 2:
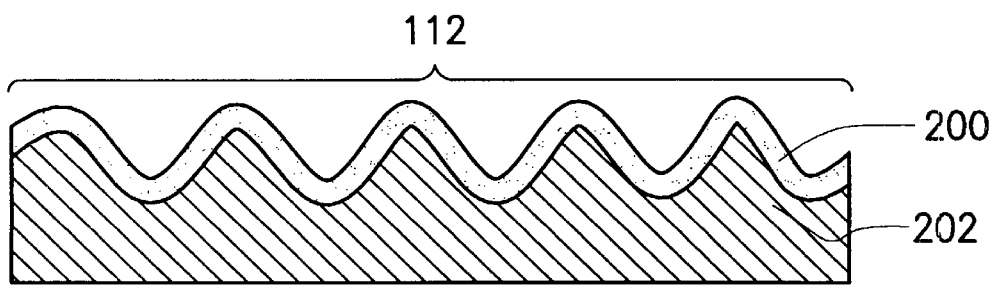
FIG. 2 shows an enlarged cross sectional view of the hemispherical grain structure formed at the bottom electrode of the DRAM capacitor shown in FIG. 1A to FIG. 1B.
Figure 3A:
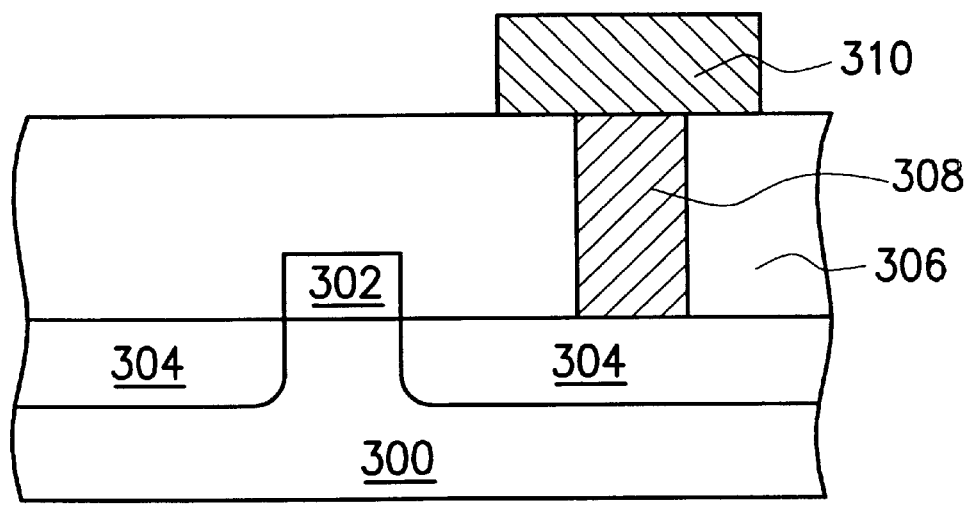
FIG. 3A to FIG. 3C show a method of forming a hemispherical grain structure on a surface of the bottom electrode of a DRAM capacitor according to the invention.
Figure 3B:
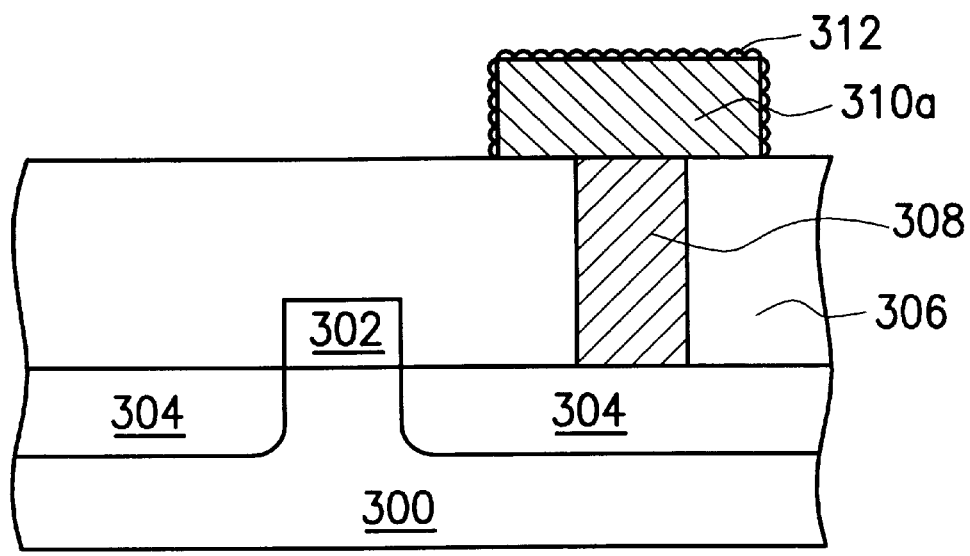
Figure 3C:
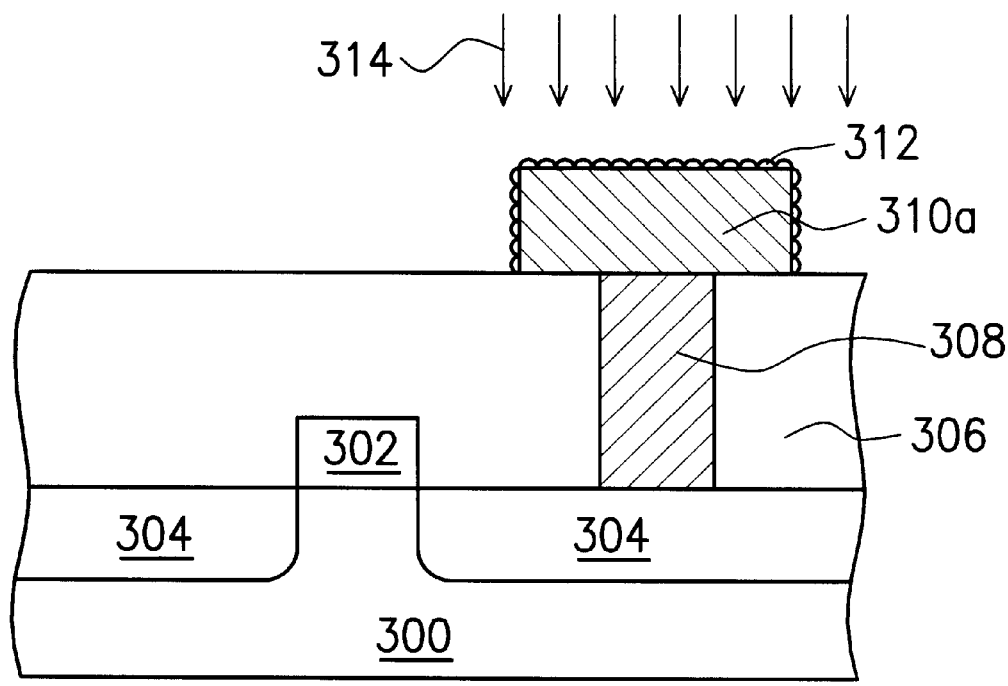

Referring to FIG. 3A to FIG. 3C, a method of forming a hemispherical grain structure of the bottom electrode of a DRAM capacitor according to the invention is shown. In FIG. 3A, a semiconductor substrate 300 comprising at least a gate 302 and a source/drain region 304 is provided. An insulation layer 306 is formed on the substrate 300 to cover both the gate 302 and source/drain region 304. Using photolithography and etching process, a contact plug 308 penetrating through the insulation layer 306 is formed to couple with the source/drain region 304. An amorphous silicon layer 310 doped with either N-type or P-type ions is formed and patterned to couple with the contact plug 308. The doped amorphous silicon layer 310 is selected because the doped one has a better conductitvty than the pure one.

In FIG. 3B, a first annealing process is performed. The substrate 300 is put into a vacuum ambient at about 550° C. to 670° C. The amorphous silicon layer is transformed into a poly-silicon layer 310a and a hemispherical grain structure 312 is formed at the surface of the poly-silicon layer 310. The dopant within the poly-silicon layer 310a is distributed during the annealing process, however, since the annealing temperature is not high enough, the dopant cannot reach the surface region of the hemispherical grain structure 312 to be uniformly distributed.

In FIG. 3C, a second annealing process, preferably, a rapid thermal process, is performed. The substrate 300 is put into an ambient containing a dopant 314 at about 700° C. to 1000° C. The an ambient containing a dopant 314 can be a P-type dopant such as $PH_3$ or an N-type such as $B^{+3}$, depending on the specific requirement of the DRAM. The second annealing process lasts for about several seconds to minutes. Since the annealing temperature is as high as about 700° C. to 1000° C., the dopant 314 contained in the ambient can penetrate into the surface region of the hemispherical grain structure 312. In addition, with a higher thermal energy, the dopant within the poly-silicon layer 310a can also be diffused to the surface. Therefore, a uniform distribution of dopant within the hemispherical grain structure 312 is obtained. That is, a much higher dopant concentration in the surface region of the hemispherical grain structure 312 is obtained.

Figure 4:
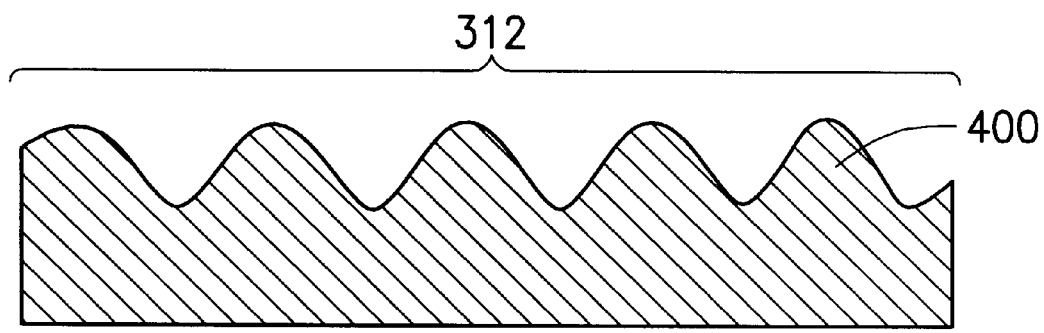
FIG. 4 shows enlarged cross sectional view of the hemispherical grain structure formed at the bottom electrode of the DRAM capacitor shown in FIG. 3A to FIG. 1C.

In FIG. 4, an enlarged view of the hemispherical grain structure 312 is shown. As shown in the figure, the dopant concentration near the surface region 400 is as high as the interior part of the hemispherical grain structure 312.

To form a capacitor, the poly-silicon layer 310a with the hemispherical grain structure 312 can be used as a bottom electrode. A dielectric layer and a top electrode are formed to cover the bottom electrode in sequence. Since the method of forming the dielectric layer and the top electrode is a known technique, it is not drawn in this figure.

Apart from coupling with the source/drain region of a MOS, the capacitor formed by the above method can also be formed to couple with some other conductive region in a substrate as required. The hemispherical grain structure 312 with a uniform dopant concentration can not only applied in forming a DRAM capacitor, but also can be applied in any structure which needs an increased surface area with a good conductivity.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a DRAM capacitor, comprising:
   providing a semiconductor substrate comprising at least a gate and source/drain region;
   forming an insulation layer to cover the gate and the source/drain region;
   forming a contact plug penetrating the insulation layer to couple with the source/drain region;
   forming and patterning a doped amorphous silicon layer to couple with the contact plug;
   performing a first annealing process to transform the doped amorphous silicon layer into a poly-silicon layer and to form a hemispherical grain structure on a surface of the poly-silicon;
   performing a second annealing process in a dopant-containing ambient on the poly-silicon layer and the hemispherical grain structure;
   forming a dielectric layer to cover the poly-silicon layer and the hemispherical grain structure; and
   forming a top electrode to cover the dielectric layer.

2. The method according to claim 1, wherein the insulation layer includes an oxide layer.

3. The method according to claim 1, wherein the doped amorphous silicon layer is an N-type amorphous silicon layer.

4. The method according to claim 1, wherein the doped amorphous silicon layer is a P-type amorphous silicon layer.

5. The method according to claim 1, wherein the first annealing process is performed under a vacuum ambient at about 550° C. to 670° C.

6. The method according to claim 1, wherein the second annealing process is performed at about 700° C. to 1000° C.

7. The method according to claim 1, wherein the doped ambient includes N-type ions.

8. The method according to claim 1, wherein the doped ambient includes P-type ions.

9. A method of forming a capacitor coupled with a conductive region of a semiconductor substrate, wherein the substrate comprises an insulation layer thereon and a plug penetrating through the insulation layer to couple with the conductive region, comprising:
   forming and patterning a doped amorphous silicon layer to couple with the plug;
   transforming the amorphous silicon layer into a poly-silicon layer with a hemispherical grain structure thereon;
   performing an annealing process in a dopant-containing ambient on the poly-silicon layer;
   forming a dielectric layer to cover the poly-silicon layer with the hemispherical grain structure thereon; and
   forming a top electrode on the dielectric layer.

10. The method according to claim 9, further comprising the step of transforming the amorphous silicon layer into the poly-silicon layer by using an anneal process.

11. The method according to claim 10, wherein the first annealing process is performed under a vacuum ambient at about 550° C. to 670° C.

12. The method according to claim 9, wherein the second annealing process is performed at about 700° C. to 1000° C.

13. The method according to claim 9, wherein the doped ambient includes N-type ions.

14. The method according to claim 9, wherein the doped ambient includes P-type ions.

15. A method of forming a hemispherical grain structure at a surface region of a poly-silicon layer, comprising:

providing a doped amorphous silicon layer;

transforming the doped amorphous silicon layer into a poly-silicon layer with the hemispherical grain structure thereon; and performing an annealing process on the poly-silicon layer in a dopant-containing ambient.

16. The method according to claim 15, further comprising the step of transforming the amorphous silicon layer into the poly-silicon layer by using an anneal process.

17. The method according to claim 15, wherein the first annealing process is performed under a vacuum ambient at about 550° C. to 670° C.

18. The method according to claim 15, wherein the second annealing process is performed at about 700° C. to 1000° C.

19. The method according to claim 15, wherein the doped ambient includes N-type ions.

20. The method according to claim 15, wherein the doped ambient includes P-type ions.

* * * * *